United States Patent

Maeda et al.

Patent Number: 5,920,594
Date of Patent: *Jul. 6, 1999

[54] TRANSVERSAL FILTER CAPABLE OF PROCESSING AN INPUT SIGNAL OF HIGH DATA RATE

[75] Inventors: Shigeki Maeda; Ichiro Kaneko, both of Tokyo, Japan

[73] Assignee: NEC Corporation, Japan

[*] Notice: This patent is subject to a terminal disclaimer.

[21] Appl. No.: 08/997,516

[22] Filed: Dec. 23, 1997

Related U.S. Application Data

[63] Continuation of application No. 08/576,842, Dec. 21, 1995, Pat. No. 5,793,806, which is a continuation of application No. 08/182,645, Jan. 14, 1994, abandoned.

[30] Foreign Application Priority Data

Jan. 18, 1993 [JP] Japan ......................................... 5-5751

[51] Int. Cl.$^6$ ................................ H03H 7/30; H03H 7/40
[52] U.S. Cl. ...................... 375/229; 375/232; 364/724.2
[58] Field of Search ..................................... 375/229, 230, 375/232, 235, 243; 333/28 R, 139; 364/724.1, 724.16, 724.19, 724.2

[56] References Cited

U.S. PATENT DOCUMENTS

| | | | |
|---|---|---|---|
| 5,005,185 | 4/1991 | Mizoguchi et al. | 375/235 |
| 5,034,908 | 7/1991 | Hartley et al. | 364/724.16 |
| 5,200,978 | 4/1993 | Lo Curto et al. | 375/286 |
| 5,243,624 | 9/1993 | Paik et al. | 375/232 |
| 5,268,927 | 12/1993 | Dimos et al. | 375/200 |
| 5,432,725 | 7/1995 | Bond | 364/724.19 |
| 5,793,806 | 8/1998 | Meada et al. | 375/232 |

FOREIGN PATENT DOCUMENTS 2190033  4/1990  Japan .

*Primary Examiner*—Chi H. Pham
*Assistant Examiner*—Khai Tran
*Attorney, Agent, or Firm*—Ostrolenk, Faber, Gerb & Soffen, LLP

[57] ABSTRACT

In a transversal filter for filtering an input signal (IN) into an output signal (OUT) in response to first through third tap gains ($C_{-1}$, $C_0$, $C_1$), the transversal filter comprises a serial-parallel converter (40) for converting the input signal into first and second parallel converted signals. Connected to the serial-parallel converter, a delay circuit (10) has first through fourth taps (11–14) and comprises a plurality of delay units (16, 17) each of which is connected between two taps selected from the first through the fourth taps. Each of the delay units provides twice a unit delay which is substantially equal to a reciprocal of an input data rate of the input signal. The first through the fourth taps of the delay circuit produce first through fourth tap signals, respectively. First and second calculation circuits (31, 32) carry out a calculation operation on three tap signals selected from the first through the fourth tap signals using the first through the third tap gains to produce first and second calculation result signals, respectively. Connected to the first and the second calculation circuits, a parallel-serial converter (35) couples the first and the second calculation result signals to produce the output signal.

4 Claims, 7 Drawing Sheets

| TIME SLOT | 1 | 2 | 3 | 4 | 5 | 6 | 7 | 8 | 9 |
|---|---|---|---|---|---|---|---|---|---|
| IN, $D_{n+1}$ | $D_1$ | $D_2$ | $D_3$ | $D_4$ | $D_5$ | $D_6$ | $D_7$ | $D_8$ | $D_9$ |
| $D_n$ | $D_0$ | $D_1$ | $D_2$ | $D_3$ | $D_4$ | $D_5$ | $D_6$ | $D_7$ | $D_8$ |
| $D_{n-1}$ | $D_{-1}$ | $D_0$ | $D_1$ | $D_2$ | $D_3$ | $D_4$ | $D_5$ | $D_6$ | $D_7$ |
| $D_{2m+1}$ | $D_1$ | | $D_3$ | | $D_5$ | | $D_7$ | | |
| $D_{2m}$ | $D_0$ | | $D_2$ | | $D_4$ | | $D_6$ | | |
| $D_{2m-1}$ | $D_{-1}$ | | $D_1$ | | $D_3$ | | $D_5$ | | |
| $\underline{D_{2m+2}}$ | | $D_2$ | | $D_4$ | | $D_6$ | | $D_8$ | |
| $\underline{D_{2m+1}}$ | | $D_1$ | | $D_3$ | | $D_5$ | | $D_7$ | |
| $\underline{D_{2m}}$ | | $D_0$ | | $D_2$ | | $D_4$ | | $D_6$ | |
| $D_{2m}{'}$ | $D_0{'}$ | | $D_2{'}$ | | $D_4{'}$ | | $D_6{'}$ | | $D_8{'}$ |
| $D_{2m+1}{'}$ | | $D_1{'}$ | | $D_3{'}$ | | $D_5{'}$ | | $D_7{'}$ | |
| OUT, $D_n{'}$ | $D_0{'}$ | $D_1{'}$ | $D_2{'}$ | $D_3{'}$ | $D_4{'}$ | $D_5{'}$ | $D_6{'}$ | $D_7{'}$ | $D_8{'}$ |

FIG. 2 PRIOR ART

| TIME SLOT | 1 | 2 | 3 | 4 | 5 | 6 | 7 | 8 | 9 |
|---|---|---|---|---|---|---|---|---|---|
| IN, $D_{n+1}$ | $D_1$ | $D_2$ | $D_3$ | $D_4$ | $D_5$ | $D_6$ | $D_7$ | $D_8$ | $D_9$ |
| $D_{2m+1}$ | | $D_1$ | | $D_3$ | | $D_5$ | | $D_7$ | |
| $D_{2m}$ | | $D_0$ | | $D_2$ | | $D_4$ | | $D_6$ | |
| $D_{2m-1}$ | | $D_{-1}$ | | $D_1$ | | $D_3$ | | $D_5$ | |
| $D_{2m-2}$ | | $D_{-2}$ | | $D_0$ | | $D_2$ | | $D_4$ | |
| 311 ($D_{2m+1}$) | | $D_1$ | | $D_3$ | | $D_5$ | | $D_7$ | |
| 312 ($D_{2m}$) | | $D_0$ | | $D_2$ | | $D_4$ | | $D_6$ | |
| 313 ($D_{2m-1}$) | | $D_{-1}$ | | $D_1$ | | $D_3$ | | $D_5$ | |
| 321 ($D_{2m}$) | | $D_0$ | | $D_2$ | | $D_4$ | | $D_6$ | |
| 322 ($D_{2m-1}$) | | $D_{-1}$ | | $D_1$ | | $D_3$ | | $D_5$ | |
| 323 ($D_{2m-2}$) | | $D_{-2}$ | | $D_0$ | | $D_2$ | | $D_4$ | |
| $D_{2m}'$ | | $D_0'$ | | $D_2'$ | | $D_4'$ | | $D_6'$ | |
| $D_{2m-1}'$ | | $D_{-1}'$ | | $D_1'$ | | $D_3'$ | | $D_5'$ | |
| OUT, $D_{n-1}'$ | $D_{-1}'$ | $D_0'$ | $D_1'$ | $D_2'$ | $D_3'$ | $D_4'$ | $D_5'$ | $D_6'$ | |

FIG. 4

| TIME SLOT | 1 | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|---|---|---|---|---|---|---|---|---|
| IN, $D_{0.5(k+1)}$ | $D_{0.5}$ | $D_{1.0}$ | $D_{1.5}$ | $D_{2.0}$ | $D_{2.5}$ | $D_{3.0}$ | $D_{3.5}$ | $D_{4.0}$ | $D_{4.5}$ | $D_{5.0}$ | $D_{5.5}$ | $D_{6.0}$ | $D_{6.5}$ | $D_{7.0}$ | $D_{7.5}$ | $D_{8.0}$ | $D_{8.5}$ | $D_{9.0}$ |
| $D_{n+0.5}$ | | $D_{0.5}$ | | $D_{1.5}$ | | $D_{2.5}$ | | $D_{3.5}$ | | $D_{4.5}$ | | $D_{5.5}$ | | $D_{6.5}$ | | $D_{7.5}$ | | $D_{8.5}$ |
| $D_n$ | | $D_{0.0}$ | | $D_{1.0}$ | | $D_{2.0}$ | | $D_{3.0}$ | | $D_{4.0}$ | | $D_{5.0}$ | | $D_{6.0}$ | | $D_{7.0}$ | | $D_{8.0}$ |
| $D_{n-0.5}$ | | $D_{-0.5}$ | | $D_{0.5}$ | | $D_{1.5}$ | | $D_{2.5}$ | | $D_{3.5}$ | | $D_{4.5}$ | | $D_{5.5}$ | | $D_{6.5}$ | | $D_{7.5}$ |
| $D_{n-1.0}$ | | $D_{-1.0}$ | | $D_{0.0}$ | | $D_{1.0}$ | | $D_{2.0}$ | | $D_{3.0}$ | | $D_{4.0}$ | | $D_{5.0}$ | | $D_{6.0}$ | | $D_{7.0}$ |
| $D_{n-1.5}$ | | $D_{-1.5}$ | | $D_{-0.5}$ | | $D_{0.5}$ | | $D_{1.5}$ | | $D_{2.5}$ | | $D_{3.5}$ | | $D_{4.5}$ | | $D_{5.5}$ | | $D_{6.5}$ |
| 311 ($D_{2m+0.5}$) | | | $D_{0.5}$ | | | | $D_{2.5}$ | | | | $D_{4.5}$ | | | | $D_{6.5}$ | | | |
| 312 ($D_{2m}$) | | | $D_{0.0}$ | | | | $D_{2.2}$ | | | | $D_{4.0}$ | | | | $D_{6.0}$ | | | |
| 313 ($D_{2m-0.5}$) | | | $D_{-0.5}$ | | | | $D_{1.5}$ | | | | $D_{3.5}$ | | | | $D_{5.5}$ | | | |
| 321 ($D_{2m-0.5}$) | | | | $D_{-0.5}$ | | | | $D_{1.5}$ | | | | $D_{3.5}$ | | | | $D_{5.5}$ | | |
| 322 ($D_{2m-1.0}$) | | | | $D_{-1.0}$ | | | | $D_{1.0}$ | | | | $D_{3.0}$ | | | | $D_{5.0}$ | | |
| 323 ($D_{2m-1.5}$) | | | | $D_{-1.5}$ | | | | $D_{0.5}$ | | | | $D_{2.5}$ | | | | $D_{4.5}$ | | |
| $D_{2m}'$ | | | | | $D_{0.0}'$ | | | | $D_{2.0}'$ | | | | $D_{4.0}'$ | | | | $D_{6.0}'$ | |
| $D_{2m-1}'$ | | | | | $D_{-1.0}'$ | | | | $D_{1.0}'$ | | | | $D_{3.0}'$ | | | | $D_{5.0}'$ | |
| OUT, $D_{n-1}'$ | | | | | | $D_{-1.0}'$ | $D_{0.0}'$ | $D_{1.0}'$ | $D_{2.0}'$ | $D_{3.0}'$ | $D_{4.0}'$ | $D_{5.0}'$ | $D_{6.0}'$ | | | | | |

FIG. 6

TRANSVERSAL FILTER CAPABLE OF PROCESSING AN INPUT SIGNAL OF HIGH DATA RATE

This is a continuation of application Ser. No. 08/576,842, filed on Dec. 21, 1995, now U.S. Pat. No. 5,793,806, which is a continuation of application Ser. No. 08/182,645, filed on Jan. 14, 1994, now abandoned.

BACKGROUND OF THE INVENTION

This invention relates to a transversal filter for use in a waveform equalization circuit in a digital communication system and, more particularly, to a transversal filter of a parallel processing type.

In general, the transversal filter is used in a waveform shaping filter such as the waveform equalization circuit in the digital communication system or an interference canceller. The transversal filter has been digitized and put to practical use due to miniaturization of the device, low power consumption, and adjustmentless. In addition, in order to be operable at a high speed, it has been made a proposal to make a plurality of transversal filters process in parallel to construct the transversal filter of the parallel processing type. Such a transversal filter of the parallel processing type has been disclosed, for example, in Japanese Unexamined Patent Prepublication No. 190033/90.

A conventional transversal filter is supplied with an input signal having an input data rate. The input signal may be a baseband digital signal which is obtained by demodulating and decision a digital modulated signal. The transversal filter filters the input signal into an output signal in response to first through J-th tap gains, where J represents a first positive integer which is not less than two. The output signal also has an output data rate equal to the input data rate. The transversal filter comprises a delay circuit which has first through J-th taps. The input signal is supplied to the delay circuit. The delay circuit comprises first through (J−1)-th delay units each of which is placed between two taps of the first through the J-th taps. Each of the first and the (J−1)-th delay units provides a unit delay which is substantially equal to a reciprocal of the input data rate. The first through the J-th taps of the delay circuit produce first through J-th tap signals, respectively.

The first through the J-th tap signals are supplied to first and second latch circuits. The first latch circuit latches the first through the J-th tap signals at each odd time slot of the input signal and holds these signals during a time duration corresponding to two time slots to produce first through J-th primary latched signals. Likewise, the second latch circuit latches the first through the J-th tap signals at each even time slot of the input signal and holds these signals during the time duration corresponding to the two time slots to produce first through J-th subsidiary latched signals.

The first through the J-th primary latched signals are supplied to a first calculation circuit. The first calculation circuit comprises first through J-th primary multiplying circuits and a first adding circuit. The first through the J-th primary multiplying circuits are supplied with the first through the J-th primary latched signals. The first through the J-th tap gains are supplied to the first through the J-th primary multiplying circuits, respectively. The first through the J-th primary multiplying circuits multiplies the first through the J-th primary latched signals by the first through the J-th tap gains to produce first through J-th primary product signals, respectively. The first through the J-th primary product signals are supplied to the first adding circuit. The first adding circuit adds up J terms of the first through the J-th primary product signals to produce a first addition result signal indicative of a first addition result of the J terms.

Likewise, the first through the J-th subsidiary latched signals are supplied to a second calculation circuit. The second calculation circuit comprises first through J-th subsidiary multiplying circuits and a second adding circuit. The first through the J-th subsidiary multiplying circuits are supplied with the first through the J-th subsidiary latched signals. The first through the J-th tap gains are supplied to the first through the J-th subsidiary multiplying circuits, respectively. The first through the J-th subsidiary multiplying circuits multiply the first through the J-th subsidiary latched signals by the first through the J-th tap gains to produce first through J-th subsidiary product signals, respectively. The first through the J-th subsidiary product signals are supplied to the second adding circuit. The second adding circuit adds up J terms of the first through the J-th subsidiary product signals to produce a second addition result signal indicative of a second addition result of the J terms.

The first and the second addition result signals are supplied to a parallel-serial converter. The parallel-serial converter carries out a parallel-serial conversion on or couples the first and the second addition result signals to produce a serial converted signal as the output signal.

As apparent from the above description, the transversal filter produces the output signal which is equalized thereby. In the conventional transversal filter, the first and the second latch circuits distribute input elements of the input signal into the first through the J-th primary latched signals and the first through the J-th subsidiary latched signals at alternative timings. In other words, each of the first and the second latch circuits serves as a serial-parallel converter for converting the input signal into J latched signals each of which has a data rate equal to a half times as large as the input data signal of the input signal. Accordingly, the first and the second calculation circuits carry out the parallel processing at a low operational speed which is equal to a half of the output data rate of the output signal. However, each of the first through the (J−1)-th delay units must carry out a delay operation at an operational speed equal to the input data rate of the input signal. As a result, the conventional transversal filter is defective in that the input data rate of the input signal and the operational speed of the transversal filter are restricted by the operational speed of the first through the (J−1)-th delay units.

SUMMARY OF THE INVENTION

It is therefore an object of this invention to provide a transversal filter capable of processing an input signal of high data rate.

It is another object of this invention to provide a transversal filter of the type described, which is operable at a high speed.

Other objects of this invention will become clear as the description proceeds.

On describing the gist of an aspect of this invention, it is possible to understand that a transversal filter filters an input signal into an output signal in response to first through J-th tap gains, where J represents a first positive integer which is not less than two. The input signal has an input data rate while the output signal has an output data rate which is equal to the input data rate.

According to the above-mentioned aspect of this invention, the above-understood transversal filter comprises a serial-parallel converter, for converting the input signal into first through M-th parallel converted signals, where M represents a second positive integer which is not less than two. Connected to the serial-parallel converter, a delay circuit has first through L-th taps, where L represents a third positive integer which is greater than the first positive integer J. The delay circuit includes first through M-th tapped delay lines provided with the first through the M-th parallel converted signals, respectively. The first through the M-th tapped delay lines have the first through the L-th taps. The delay circuit comprises a plurality of delay units each of which is connected between two taps selected from the first through the L-th taps. Each of the delay units provides a delay of M times a unit delay which substantially equal to a reciprocal of the input data rate. The first through the L-th taps of the delaying circuit produce first through L-th tap signals, respectively. Each of first through M-th calculation circuits is supplied with the first through the J-th tap gains and J tap signals selected from the first through the L-th tap signals. Also each of the first through the M-th calculation circuits is connected to the first through the M-th tapped delay lines. The first through the M-th calculation circuits carry out a calculation operation on the J tap signals using the first through the J-th tap gains to produce first through M-th calculation result signals, respectively. Connected to the first through the M-th calculation circuits, a coupling circuit couples the first through the M-th calculation result signals to produce the output signal.

On describing the gist of a different aspect of this invention, it is possible to understand that a transversal filter filters an input signal into an output signal in response to first through J-th tap gains, where J represents a first positive integer which is not less than two. The input signal has an input data rate while the output signal has an output data rate which is equal to a half of the input data rate.

According to the different aspect of this invention, the afore-understood transversal filter comprises a serial-parallel converter, for converting the input signal into first through M-th parallel converted signals, where M represents a second positive integer which is not less than two. Connected to the serial-parallel converter, a delay circuit has first through L-th taps, where L represents a third positive integer which is greater than the first positive integer J. The delay circuit includes first through M-th tapped delay lines provided with the first through the M-th parallel converted signals, respectively. The first through the M-th tapped delay lines have the first through the L-th taps. The delay circuit comprises a plurality of delay units each of which is connected between two taps selected from the first through L-th taps. Each of the delay units provides a delay of M times a unit delay which substantially equal to a reciprocal of the input data rate. The first through L-th taps of the delaying circuit produce first through L-th tap signals, respectively. Each of the first through M-th latch circuits is supplied with J tap signals selected from the first through the L-th tap signals. Each of the first through the M-th latch circuits is connected to the first through the M-th tapped delay lines. Also, each of the first through the M-th latch circuits latches the J tap signals and holding the J tap signals during a time duration which is substantially equal to twice a reciprocal of the output data rate to produce first through J-th latch signals. First through M-th calculation circuits are connected to the first through the M-th latch circuits, respectively. Each of the first through the M-th calculation circuits is supplied with the first through the J-th tap gains. The first through the M-th calculation circuits carry out a calculation operation on the first through the J-th latch signals using the first through the J-th tap gains to produce first through M-th calculation result signals, respectively. Connected to the first through the M-th calculation circuits, a coupling circuit couples the first through the M-th calculation result signals to produce the output signal.

BRIEF DESCRIPTION OF THE DRAWINGS

FIG. 2 shows a time chart for use in describing an operation of the conventional transversal filter illustrated in FIG. 1;

FIG. 4 shows a time chart for use in describing an operation of the transversal filter illustrated in FIG. 3;

FIG. 6 shows a time chart for use in describing an operation of the transversal filter illustrated in FIG. 5;

DESCRIPTION OF THE PREFERRED EMBODIMENTS

Figure 1:
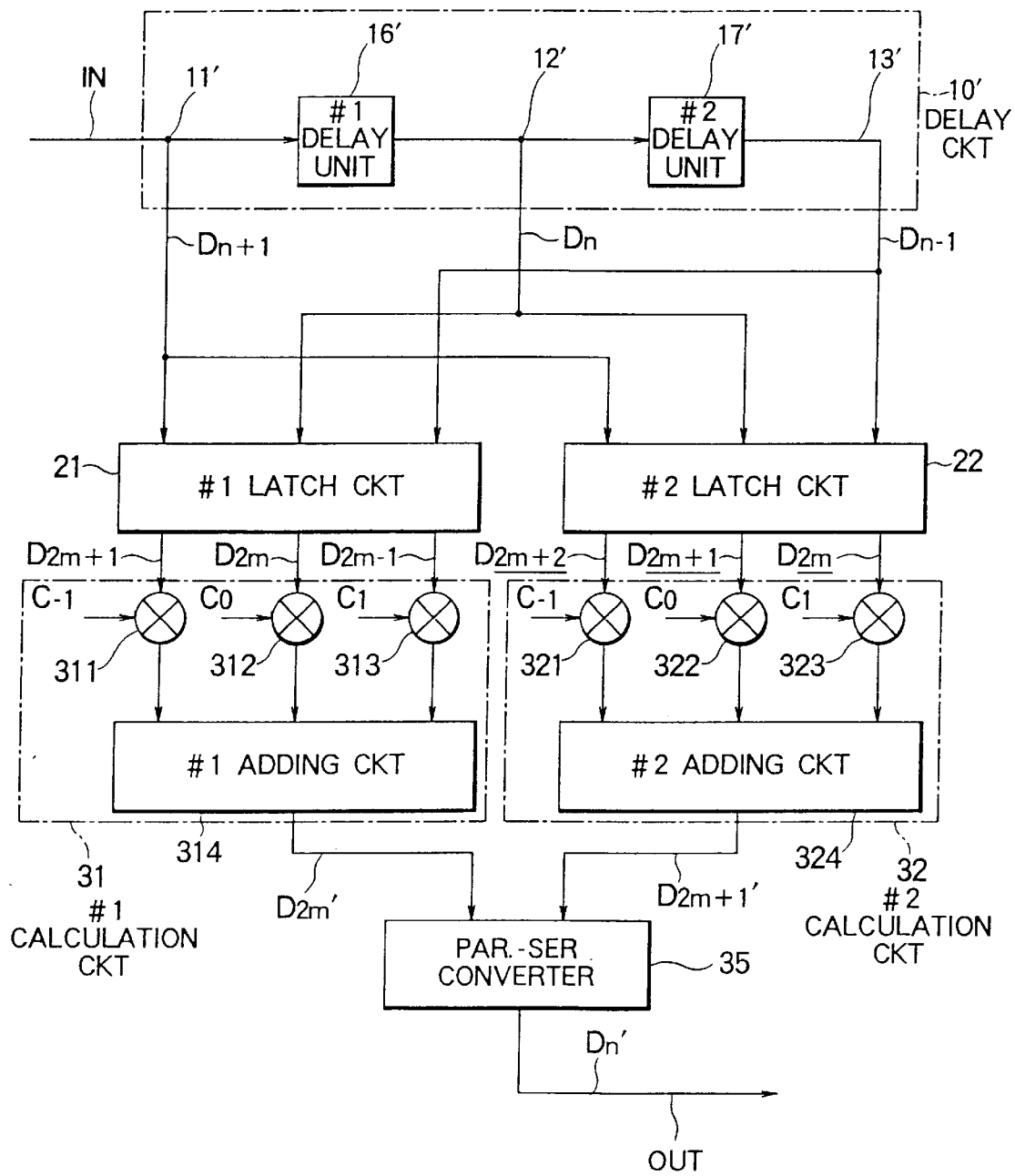
FIG. 1 is a block diagram of a conventional transversal filter.

Referring to FIG. 1, a conventional transversal filter of a parallel processing type will be described at first in order to facilitate an understanding of the present invention. The illustrated transversal filter is a three-tap transversal filter supplied with an input signal IN. In the example being illustrated, the input signal IN has an input data rate and is a digital signal having waveform shaped. The input signal IN may be a baseband digital signal which is obtained by demodulating and decision a digital modulated signal which is transmitted at a predetermined modulation rate.

The three-tap transversal filter filters the input signal IN into an output signal OUT in response to first through J-th controllable tap gains, where J represents a first positive integer which is not less than two. In the example being illustrated, the first positive integer J is equal to three and the three-tap transversal filter therefore responds to the first through the third tap gains which may be specified by $C_{-1}$, $C_0$, and $C_1$. The output signal OUT has an output data rate equal to the input data rate. The three-tap transversal filter comprises a delay circuit 10' which has first through third taps 11', 12', and 13'. The second tap 12' may be called a central tap. The first and the third taps 11' and 13' are depicted on the lefthand and the righthand sides of the central tap 12'. The first and the third taps 11' and 13' may be referred to as first and second additional taps.

The input signal IN is supplied to the delay circuit 10'. The delay circuit 10' comprises only one tapped delay line which includes first and second delay units 16' and 17' which are placed between the first and the second taps 11' and 12' and between the second and the third taps 12' and 13', respectively. Each of the first and the second delay units 16' and 17' provides a unit delay which is substantially equal to a reciprocal of the input data rate. The input signal IN is delivered to the first tap 11' as a first tap signal and successively delayed by the first and the second delay units 16' and 17' to be produced as second and third tap signals which are sent to the second and the third taps 12' and 13', respectively.

Let the first through the third taps 11', 12', and 13' be specified by consecutive numbers of (−1), 0, and (+1), respectively, taking the successive delays into consideration. In this connection, the first tap signal appearing as the (−1) tap 11' may be specified by $D_{n+1}$. Likewise, the second and the third tap signals may be specified by $D_n$ and $D_{n-1}$, respectively. Since the first tap signal $D_{n+1}$ is identical with the input signal IN with no delay, it may be called a zeroth delayed signal. Likewise, the second and the third tap signals $D_n$ and $D_{n-1}$ may be referred to as first and second delay signals, respectively. At any rate, the delay circuit 10' produces the zeroth through the second delayed signals $D_{n+1}$, $D_n$ and $D_{n-1}$.

The zeroth through the second delayed signals $D_{n+1}$, $D_n$ and $D_{n-1}$ are supplied to first and second latch circuits 21 and 22. That is, each of the first and the second latch circuits 21 and 22 is connected to only one tapped delay line of the delay circuit 10'. The first latch circuit 21 latches the zeroth through the second delayed signals $D_{n+1}$, $D_n$, and $D_{n-1}$ at each odd time slot of the input signal IN and holds these signals during a time duration corresponding to two time slots to produce first through third primary latched signals $D_{2m+1}$, $D_{2m}$, and $D_{2m-1}$. Likewise, the second latch circuit 22 latches the zeroth through the second delayed signals $D_{n+1}$, $D_n$, and $D_{n-1}$ at each even time slot of the input signal IN and holds these signals during the time duration corresponding to the two time slots to produce first through third subsidiary latched signals $D_{2m+2}$, $D_{2m+1}$, and $D_{2m}$. The first through the third primary latched signals $D_{2m+1}$, $D_{2m}$, and $D_{2m-1}$ are supplied to a first calculation circuit 31. The first calculation circuit 31 carries out a calculation operation on the first through the third primary latched signals $D_{2m+1}$, $D_{2m}$, and $D_{2m-1}$ using the first through the third tap gains $C_{-1}$, $C_0$, and $C_1$ to produce a first calculation result signal. The first calculation circuit 31 comprises first through third primary multiplying circuits 311, 312, and 313 and a first adding circuit 314.

The first through the third primary multiplying circuits 311 to 313 are supplied with the first through the third primary latched signals $D_{2m+1}$, $D_{2m}$, and $D_{2m-1}$. The first through the third tap gains $C_{-1}$, $C_0$, and $C_1$ are supplied to the first through the third primary multiplying circuits 311 to 313, respectively. The first primary multiplying circuit 311 multiplies the first primary latched signal $D_{2m+1}$ by the first tap gain $C_{-1}$ to produce a first primary product signal indicative of a product of the first primary latched signal $D_{2m+1}$ and the first tap gain $C_{-1}$. The second primary multiplying circuit 312 multiplies the second primary latched signal $D_{2m}$ by the second tap gain $C_0$ to produce a second primary product signal indicative of a product of the second primary latched signal $D_{2m}$ and the second tap gain $C_0$. The third primary multiplying circuit 313 multiplies the third primary latched signal $D_{2m-1}$ by the third tap gain $C_1$ to produce a third primary product signal indicative of a product of the third primary latched signal $D_{2m-1}$ and the third tap gain $C_1$. The first through the third primary product signals are supplied to the first adding circuit 314. The first adding circuit 314 adds up three terms of the first through the third primary product signals to produce, as the first calculation result signal, a first addition result signal $D_{2m}'$ indicative of a first addition result of the three terms.

Likewise, the first through the third subsidiary latched signals $D_{2m+2}$, $D_{2m+1}$, and $D_{2m}$ are supplied to a second calculation circuit 32. The second calculation circuit 32 carries out a calculation operation on the first through the third subsidiary latched signals $D_{2m+2}$, $D_{2m+1}$, and $D_{2m}$ using the first through the third tap gains $C_{-1}$, $C_0$, and $C_1$ to produce a second calculation result signal. The second calculation circuit 32 comprises first through third subsidiary multiplying circuits 321, 322, and 323 and a second adding circuit 324.

The first through the third subsidiary multiplying circuits 321 to 323 are supplied with the first through the third subsidiary latched signals $D_{2m+2}$, $D_{2m+1}$, and $D_{2m}$. The first through the third tap gains $C_{-1}$, $C_0$, and $C_1$ are supplied to the first through the third subsidiary multiplying circuits 321 to 323, respectively. The first subsidiary multiplying circuit 321 multiplies the first subsidiary latched signal $D_{2m+2}$ by the first tap gain $C_{-1}$ to produce a first subsidiary product signal indicative of a product of the first subsidiary latched signal $D_{2m+2}$ and the first tap gain $C_{-1}$. The second subsidiary multiplying circuit 322 multiplies the second subsidiary latched signal $D_{2m+1}$ by the second tap gain $C_0$ to produce a second subsidiary product signal indicative of a product of the second subsidiary latched signal $D_{2m+1}$ and the second tap gain $C_0$. The third subsidiary multiplying circuit 323 multiplies the third subsidiary latched signal $D_{2m}$ by the third tap gain $C_1$ to produce a third subsidiary product signal indicative of a product of the third subsidiary latched signal $D_{2m}$ and the third tap gain $C_1$. The first through the third subsidiary product signals are supplied to the second adding circuit 324. The second adding circuit 324 adds up three terms of the first through the third subsidiary product signals to produce, as the second calculation result signal, a second addition result signal $D_{2m+1}'$ indicative of a second addition result of the three terms.

The first and the second addition result signals $D_{2m}'$ and $D_{2m+1}'$ are supplied to a parallel-serial converter 35. The parallel-serial converter 35 carries out a parallel-serial conversion on or couples the first and the second addition result signals $D_{2m}'$ and $D_{2m+1}'$ to produce a serial converted signal $D_n'$ as the output signal OUT.

Referring to FIG. 2 in addition to FIG. 1, description will be directed to operation of the conventional transversal filter illustrated in FIG. 1. First through ninth input time slots are indicated along a first or top line in FIG. 2 by numerals 1 through 9.

The input signal IN or the zeroth delayed signal $D_{n+1}$ is indicated along a second line. Third and fourth lines show the first and the second delayed signals $D_n$ and $D_{n-1}$, respectively. Fifth through seventh lines show the first through the third primary latched signals $D_{2m+1}$, $D_{2m}$, and $D_{2m-1}$, respectively. Eighth through tenth lines show the first through the third subsidiary latched signals $D_{2m+2}$, $D_{2m+1}$, and $D_{2m}$, respectively. Eleventh and twelfth lines show the first and the second addition result signals $D_{2m}'$ and $D_{2m+1}'$, respectively. A thirteenth line shows the output signal OUT or the serial converted signal $D_{n'}$.

The input signal IN or the zeroth delayed signal $D_{n+1}$ omprises a series of input elements such as first through ninth input elements $D_1$, $D_2$, $D_3$, $D_4$, $D_5$, $D_6$, $D_7$, $D_8$, and $D_9$ of the first through the ninth input time slots 1 to 9. Similarly, the first delayed signal $D_n$ comprises a series of primary delayed elements such as first through ninth primary delayed elements which are equal to zeroth through eighth input elements $D_0$ to $D_8$ of a zeroth through the eighth input time slots 0 to 8. The second delayed signal $D_{n-1}$ comprises a series of secondary delayed elements such as first through ninth secondary delayed elements which are equal to one time slot previous to the zeroth or (−1)-th through seventh elements $D_{-1}$ to $D_7$ of a (−1)-th through the seventh input time slots −1 to 7.

The first primary latched signal $D_{2m+1}$ comprises a series of primary latched elements having input time slots each of which is equal in number to an odd number such as the first input element $D_1$ of the first input time slot 1, the third input element $D_3$ of the third input time slot 3, the fifth input element $D_5$ of the fifth input time slot 5, the seventh input element $D_7$ of the seventh input time slot 7. The second primary latched signal $D_{2m}$ comprises a series of primary latched elements having input time slots each of which is equal in number to an odd number such as the first primary delayed element $D_0$ of the first input time slot 1, the third primary delayed element $D_2$ of the third input time slot 3, the fifth primary delayed element $D_4$ of the fifth input time slot 5, the seventh primary delayed element $D_6$ of the seventh input time slot 7. The third primary latched signal $D_{2m-1}$ comprises a series of primary latched elements having input time slots each of which is equal in number to an odd number such as the first secondary delayed element $D_{-1}$ of the first input time slot 1, the third secondary delayed element $D_1$ of the third input time slot 3, the fifth secondary delayed element $D_3$ of the fifth input time slot 5, the seventh secondary delayed element $D_5$ of the seventh input time slot 7.

The first subsidiary latched signal $D_{2m+2}$ comprises a series of subsidiary latched elements having input time slots each of which is equal in number to an even number such as the second input element $D_2$ of the second input time slot 2, the fourth input element $D_4$ of the fourth input time slot 4, the sixth input element $D_6$ of the sixth input time slot 6, the eighth input element $D_8$ of the eighth input time slot 8. The second subsidiary latched signals $D_{2m+1}$ comprises a series of subsidiary latched elements having input time slots each of which is equal in number to an even number such as the second primary delayed element $D_1$ of the second input time slot 2, the fourth primary delayed element $D_3$ of the fourth input time slot 4, the sixth primary delayed element $D_5$ of the sixth input time slot 6, the eighth primary delayed element $D_7$ of the eighth input time slot 8. The third subsidiary latched signal $D_{2m}$ comprises a series of subsidiary latched elements having input time slots each of which is equal in number to an even number such as the second secondary delayed element $D_0$ of the second input time slot 2, the fourth secondary delayed element $D_2$ of the fourth input time slot 4, the sixth secondary delayed element $D_4$ of the sixth input time slot 6, the eighth secondary delayed element $D_6$ of the eighth input time slot 8.

The first addition result signal $D_{2m}'$ comprises a series of addition result elements having output time slots each of which is equal in number to an even number such as a zeroth addition result element $D_0'$ of a zeroth output time slot, a second addition result element $D_2'$ of a second output time slot, a fourth addition result element $D_4'$ of a fourth output time slot, a sixth addition result element $D_6'$ of a sixth output time slot, an eighth addition result element $D_8'$ of an eighth output time slot. Similarly, the second addition result signal $D_{2m+1}'$ comprises a series of addition result elements having output time slots each of which is equal in number to an odd number such as a first addition result element $D_1'$ of a first output time slot, a third addition result element $D_3'$ of a third output time slot, a fifth addition result element $D_5'$ of a fifth output time slot, a seventh addition result element $D_7'$ of a seventh output time slot.

The output signal OUT or the serial converted signal $D_n'$ comprises a series of addition result elements such as the zeroth through the eighth addition result elements $D_0'$ to $D_8'$ of the zeroth through the eighth output time slots. The output signal OUT or the serial converted signal $D_n'$ is given by:

$$D_n' = C_{-1} \times D_{n+1} + C_0 \times D_n + C_1 \times D_{n-1}.$$

The first through the third tap gains $C_{-1}$, $C_0$, and $C_1$ may be automatically controlled by a control circuit (not shown) when the three-tap transversal filter is used in a waveform equalization circuit or an interference canceller. In this event, the first through the third tap gains $C_{-1}$, $C_0$, and $C_1$ supplied to the first calculation circuit 31 are different from those supplied to the second calculation circuit 32. This is because the first through the third tap gains $C_{-1}$, $C_0$, and $C_1$ vary every moment. The first through the third tap gains $C_{-1}$, $C_0$, and $C_1$ may be fixed at predetermined values when the three-tap transversal filter is used in a digital filter such as a roll-off filter.

As apparent from the above description, the transversal filter produces the output signal OUT which is equalized thereby. In the conventional transversal filter, the first and the second latch circuits 21 and 22 distribute the input elements of the input signal IN into the first through the third primary latched signals $D_{2m+1}$, $D_{2m}$, and $D_{2m-1}$ and the first through the third subsidiary latched signals $D_{2m+2}$, $D_{2m+1}$, and $D_{2m}$ at alternative timings. In other words, each of the first and the second latch circuits 21 and 22 serves as a serial-parallel converter for converting the input signal IN into three latched signals each of which has a data rate equal to a half times as large as the input data rate of the input signal IN. Accordingly, the first and the second calculation circuits 31 and 32 carry out the parallel processing at a low operational speed which is equal to a half of the output data rate of the output signal OUT. However, each of the first and the second delay units 16' and 17' must carry out a delay operation at an operational speed equal to the input data rate of the input signal IN. As a result, the conventional transversal filter is defective in that the input data rate of the input signal IN and the operational speed of the transversal filter are restricted by the operational speed of the first and the second delay units 16' and 17', as mentioned in the preamble of the instant specification.

Figure 3:
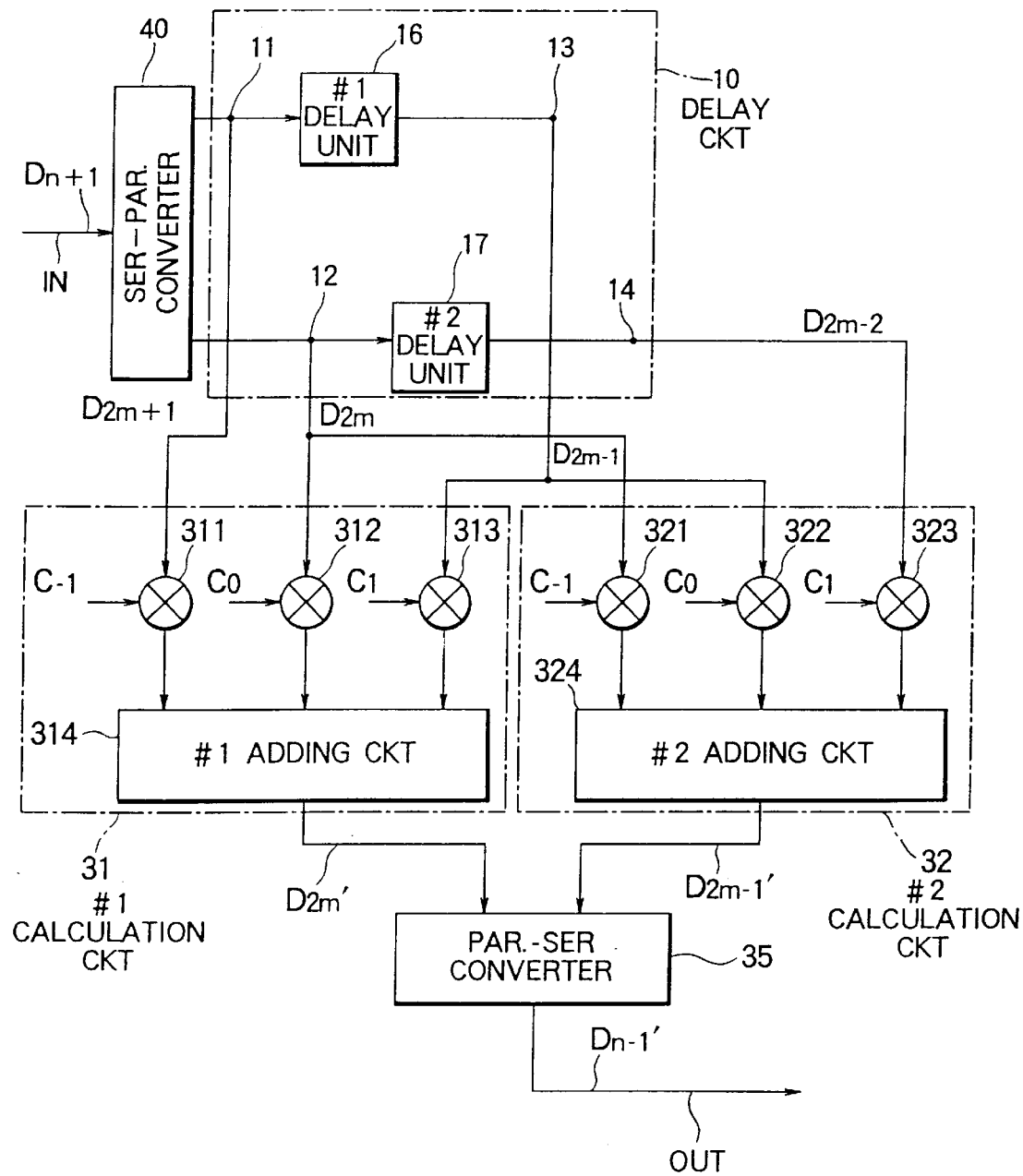
FIG. 3 is a block diagram of a transversal filter according to a first embodiment of this invention.

Referring to FIG. 3, the description will proceed to a transversal filter of a parallel processing type according to a first embodiment of this invention. The transversal filter is similar in structure and operation to the conventional transversal filter illustrated in FIG. 1 except that the transversal filter comprises a serial-parallel converter 40 in place of the first and the second latch circuits 21 and 22. In addition, the delay circuit is modified in the manner which will later be described. The delay circuit is therefore depicted at the reference numeral 10. In the transversal filter, the input signal IN and the output signal OUT have the input and the output data rates which are equal to each other.

The serial-parallel converter 40 is supplied with the input signal IN or $D_{n+1}$. The serial-parallel converter 40 converts the input signal IN into first and M-th parallel converted signals, where M represents a second positive integer which is not less than two. In the example being illustrated, the second positive integer M is equal to two and the serial-parallel converter 40 therefore produces the first and the second parallel converted signals $D_{2m+1}$ and $D_{2m}$.

The first and the second parallel converted signals $D_{2m+1}$ and $D_{2m}$ are supplied to the delay circuit 10. The delay circuit 10 has first through L-th taps, where L represents a third positive integer which is larger than the first positive integer J. In the example being illustrated, the third positive integer L is equal to four and the delay circuit 10 therefore has the first through the fourth taps 11, 12, 13, and 14. The delay circuit 10 comprises first through second (or M-th) tapped delay lines which are provided with the first and the second parallel converted signals $D_{2m+1}$ and $D_{2m}$, respectively. As shown in FIG. 3, the first tapped delay line has the first and the third taps 11 and 13 while the second tapped delay line has the second and the fourth taps 12 and 14. The first parallel converted signal $D_{2m+1}$ is supplied to the first tap 11 while the second parallel converted signal $D_{2m}$ is supplied to the second tap 12. The first tap 11 produces the first parallel converted signal $D_{2m+1}$ as a first tap signal as it is. Likewise, the second tap 12 produces the second parallel converted signal $D_{2m}$ as a second tap signal as it is. The delay circuit 10 comprises first and second delay units 16 and 17 which are placed between the first and the third taps 11 and 13 and between the second and the fourth taps 12 and 14, respectively. Each of the first and the second delay units 16 and 17 provides twice the unit delay which is substantially equal to the reciprocal of the input data rate.

The first parallel converted signal $D_{2m+1}$ is delivered to the first tap 11 and successively delayed by the first delay unit 16 to be produced as a third tap signal $D_{2m-1}$ which is sent to the third tap 13. Likewise, the second parallel converted signal $D_{2m}$ is delivered to the second tap 12 and successively delayed by the second delay unit 17 to be produced as a fourth tap signal $D_{2m-2}$ which is sent to the fourth tap 14. At any rate, the delay circuit 10 produces the first through the fourth tap signals $D_{2m+1}$, $D_{2m}$, $D_{2m-1}$, and $D_{2m-2}$.

The first through the third tap signals $D_{2m+1}$, $D_{2m}$, and $D_{2m-1}$ are supplied to the first calculation circuit 31 as first through third primary tap signals, respectively. The second through the fourth tap signals $D_{2m}$, $D_{2m-1}$, and $D_{2m-2}$ are supplied to the second calculation circuit 32 as first through third subsidiary tap signals, That is, each of the first and the second calculation circuits 31 and 32 is connected to the first and the second tapped delay lines of the delay circuit 10, respectively.

In the first calculation circuit 31, the first through the third primary multiplying circuits 311 to 313 are supplied with the first through the third primary tap signals $D_{2m+1}$, $D_{2m}$, and $D_{2m-1}$. The first primary multiplying circuit 311 multiplies the first primary tap signal $D_{2m+1}$ by the first tap gain $C_{-1}$ to produce a first primary product signal indicative of a product of the first primary tap signal $D_{2m+1}$ and the first tap gain $C_{-1}$. The second primary multiplying circuit 312 multiplies the second primary tap signal $D_{2m}$ by the second tap gain $C_0$ to produce a second primary product signal indicative of a product of the second primary tap signal $D_{2m}$ and the second tap gain $C_0$. The third primary multiplying circuit 313 multiplies the third primary tap signal $D_{2m-1}$ by the third tap gain $C_1$ to produce a third primary product signal indicative of a product of the third primary tap signal $D_{2m-1}$ and the third tap gain $C_1$. The first through the third primary product signals are supplied to the first adding circuit 314. The first adding circuit 314 adds up three terms of the first through the third primary product signals to produce a first addition result signal $D_{2m}'$ indicative of a first addition result of the three terms.

In the second calculation circuit 32, the first through the third subsidiary multiplying circuits 321 to 323 are supplied with the first through the third subsidiary tap signals $D_{2m}$, $D_{2m-1}$, and $D_{2m-2}$. The first subsidiary multiplying circuit 321 multiplies the first subsidiary tap signal $D_{2m}$ by the first tap gain $C_{-1}$ to produce a first subsidiary product signal indicative of a product of the first subsidiary tap signal $D_{2m}$ and the first tap gain $C_{-1}$. The second subsidiary multiplying circuit 322 multiplies the second subsidiary tap signal $D_{2m-1}$ by the second tap gain $C_0$ to produce a second subsidiary product signal indicative of a product of the second subsidiary tap signal $D_{2m-1}$ and the second tap gain $C_0$. The third subsidiary multiplying circuit 323 multiplies the third subsidiary tap signal $D_{2m-2}$ by the third tap gain $C_1$ to produce a third subsidiary product signal indicative of a product of the third subsidiary tap signal $D_{2m-2}$ and the third tap gain $C_1$. The first through the third subsidiary product signals are supplied to the second adding circuit 324. The second adding circuit 324 adds up three terms of the first through the third subsidiary product signals to produce a second addition result signal $D_{2m-1}'$ indicative of a second addition result of the three terms.

The first and the second addition result signals $D_{2m}'$ and $D_{2m-1}'$ are supplied to the parallel-serial converter 35. The parallel-serial converter 35 carries out a parallel-serial conversion on or couples the first and the second addition result signals $D_{2m}'$ and $D_{2m-1}'$ to produce a serial converted signal $D_{n-1}'$ as the output signal OUT.

As apparent from the above description, the first and the second addition result signals $D_{2m}'$ and $D_{2m-1}'$ are given by:

$$D_{2m}'=C_{-1} \times D_{2m+1} C_0 \times D_{2m}+C_1 \times D_{2m-1}'$$

and $$D_{2m-1}'=C_{-1} \times D_{2m}+C_0 \times D_{2m-1}+C_1 \times D_{2m-2}.$$

The output signal OUT or the serial converted signal $D_n'$ is therefore given by:

$$D_n'=C_{-1} \times D_{n+1}+C_0 \times D_n+C_1 \times D_{n-1}.$$

Referring to FIG. 4 in addition to FIG. 3, description will be directed to operation of the transversal filter illustrated in FIG. 3. First through ninth input time slots are indicated along a first or top line in FIG. 4 by numerals 1 through 9.

The input signal IN or $D_{n+1}$ is indicated along a second line. Third through sixth lines show the first through the fourth tap signals $D_{2m+1}$, $D_{2m}$, $D_{2m-1}$, and $D_{2m-2}$, respectively. Seventh through ninth lines show the first through the third primary tap signals $D_{2m+1}$, $D_{2m}$, and $D_{2m-1}$ which are supplied to the first through the third primary multiplying circuits 311 to 313 in the first calculation circuit 31, respectively. Tenth through twelfth lines show the first through the third subsidiary tap signals $D_{2m}$, $D_{2m-1}$, and $D_{2m-2}$ which are supplied to the first through the third subsidiary multiplying circuits 321 to 323 in the second calculation circuit 32, respectively. Thirteenth and fourteenth lines show the first and the second addition result signals $D_{2m}'$ and $D_{2m-1}'$, respectively. A fifteenth line shows the output signal OUT or the serial converted signal $D_{n-1}'$.

The input signal IN or $D_{n+1}$ comprises a series of input elements such as first through ninth input elements $D_1$, $D_2$, $D_3$, $D_4$, $D_5$, $D_6$, $D_7$, $D_8$, $D_9$ of the first through the ninth input time slots 1 to 9.

The first tap signal $D_{2m+1}$ comprises a series of primary tap elements having input time slots each of which is equal in number to an odd number such as the first input element $D_1$ of the first input time slot 1, the third input element $D_3$ of the third input time slot 3, the fifth input element $D_5$ of the fifth input time slot 5, the seventh input element $D_7$ of the seventh input time slot 7. The second tap signal $D_{2m}$ comprises a series of secondary tap elements having input time slots each of which is equal in number to an even number such as a zeroth input element $D_0$ of a zeroth input time slot 0, the second input element $D_2$ of the second input time slot 2, the fourth input element $D_4$ of the fourth input time slot 4, the sixth input element $D_6$ of the sixth input time slot 6. The third tap signal $D_{2m-1}$ comprises a series of tertiary tap elements having input time slots each of which is equal in number to an odd number such as one time slot previous to the zeroth or a $(-1)$-th input element $D_{-1}$ of a (−1)-th input time slot −1, the first input element $D_1$ of the first input time slot 1, the third input element $D_3$ of the third input time slot 3, the fifth input element $D_5$ of the fifth input time slot 5. The fourth tap signal $D_{2m-1}$ comprises a series of quaternary tap elements having input time slots each of which is equal to an even number such as two time slots previous to the zeroth or a (−2)-th input element $D_{-2}$ of a (−2)-th input time slot −2, the zeroth input element $D_0$ of the zeroth input time slot 0, the second input element $D_2$ of the second input time slot 2, the fourth input element $D_4$ of the fourth input time slot 4.

The first through the third primary tap signals $D_{2m+1}$, $D_{2m}$, and $D_{2m-1}$ are equal to the first through the fourth tap signals $D_{2m+1}$, $D_{2m}$, and $D_{2m-1}$, respectively. The first through the third subsidiary tap signals $D_{2m}$, $D_{2m-1}$, and $D_{2m-2}$ are equal to the second through the fourth tap signals $D_{2m}$, $D_{2m-1}$, and $D_{2m-2}$, respectively.

The first addition result signal $D_{2m}'$ comprises a series of addition result elements having output time slots each of which is equal in number to an even number such as a zeroth addition result element $D_0'$ of a zeroth output time slot, a second addition result element $D_2'$ of a second output time slot, a fourth addition result element $D_4'$ of a fourth output time slot, a sixth addition result element $D_6'$ of a sixth output time slot. Similarly, the second addition result signal $D_{2m-1}'$ comprises a series of addition result elements having output time slots each of which is equal in number to an odd number such as a (−1)-th addition result element $D_{-1}'$ of a (−1)-th output time slot, a first addition result element $D_1'$ of a first output time slot, a third addition result element $D_3'$ of a third output time slot, a fifth addition result element $D_5'$ of a fifth output time slot.

The output signal OUT or the serial converted signal $D_{n-1}'$ comprises a series of the addition result elements such as the (−1)-th through the sixth addition result elements $D_{-1}'$ to $D_6'$ of the (−1)-th through the sixth output time slots.

Figure 5:
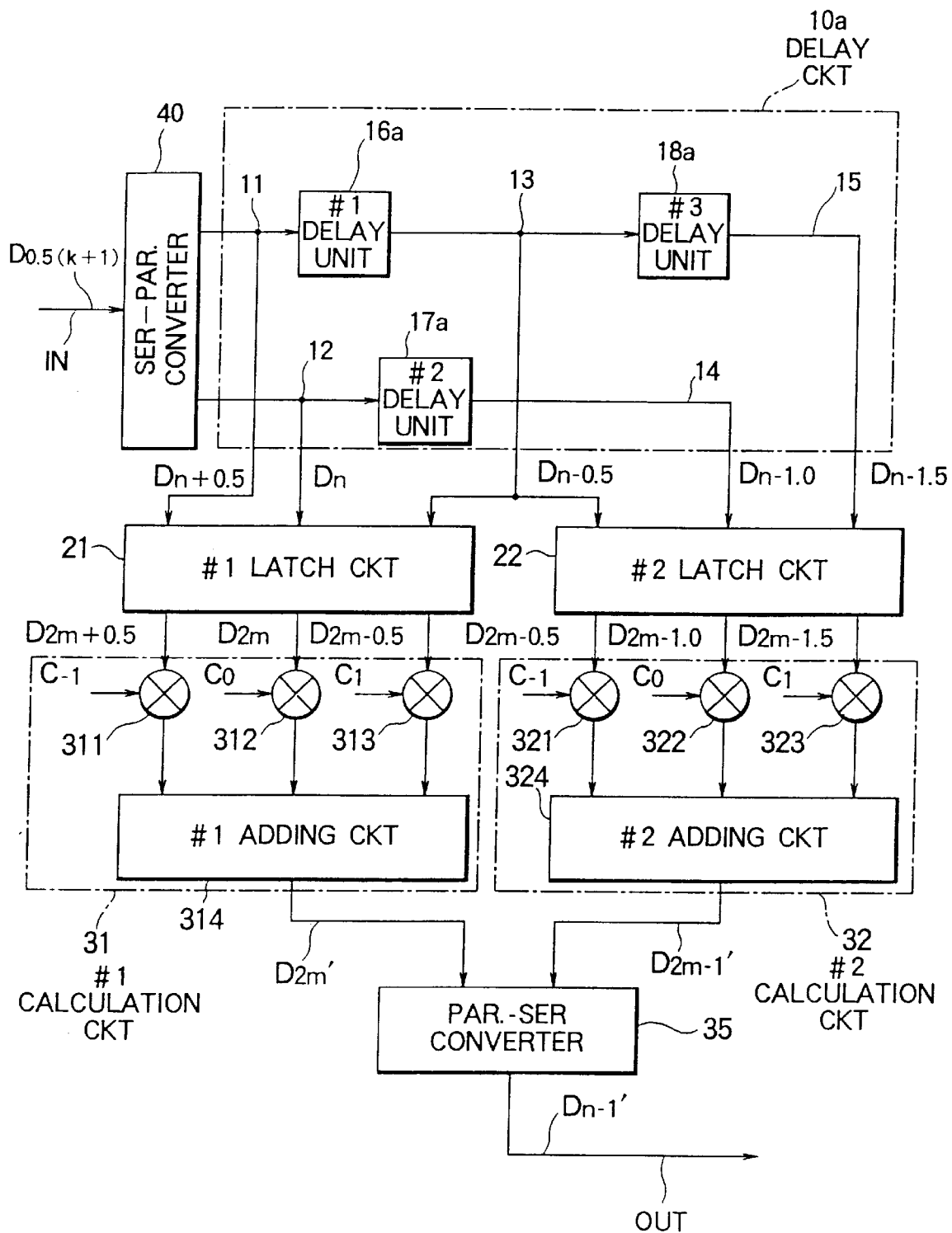
FIG. 5 is a block diagram of a transversal filter according to a second embodiment of this invention.

Referring to FIG. 5, the description will proceed to a transversal filter of a parallel processing type according to a second embodiment of this invention. The transversal filter is similar in structure and operation to the conventional transversal filter illustrated in FIG. 1 except that the transversal filter comprises the serial-parallel converter 40 and the delay circuit is modified in the manner which will later be described. The delay circuit is therefore depicted at the reference numeral 10a. In the transversal filter, the input signal IN has the input data rate which is twice the output data rate of the output signal OUT. The illustrated transversal filter is a transversal filter having a tap interval which is a half of a symbol interval and the illustrated transversal filter is applicable to the digital filter such as the interference canceller or the roll-off filter. In the example being illustrated, the input signal IN is a digital signal having waveform shaped. Such a digital signal is a baseband digital signal which is obtained by demodulating and decision a digital modulated signal. Its decision timing has an interval which is a half of the symbol interval. In other words, the input data rate is twice a bit rate of the input signal IN.

The serial-parallel converter 40 is supplied with the input signal IN or $D_{0.5(k+1)}$. The serial-parallel converter 40 converts the input signal IN into first and second parallel converted signals $D_{n+0.5}$ and $D_n$.

The first and the second parallel signals $D_{n+0.5}$ and $D_n$ are supplied to the delay circuit 10a. The delay circuit 10 has first through L-th taps, where L represents the third positive integer which is larger than the first positive integer J. In the example being illustrated, the third positive integer is equal to five and the delay circuit 10a. Therefore has the first through the fifth taps 11, 12, 13, 14, and 15. The delay circuit 10a comprises first through second (or M-th) tapped delay lines which are provided with the first and the second parallel converted signals $D_{n+0.5}$ and $D_n$, respectively. As shown in FIG. 5, the first tapped delay line has the first, the third, and the fifth taps 11, 13 and 15 while the second tapped delay line has the second and the fourth taps 12 and 14. The first parallel converted signal $D_{n+0.5}$ is supplied to the first tap 11 while the second parallel converted signal $D_n$ is supplied to the second tap 12. The first tap 11 produces the first parallel converted signal $D_{n+0.5}$ as a first tap signal as it is. Likewise, the second tap 12 produces the second parallel converted signal $D_n$ as a second tap signal as it is. The delay circuit 10a comprises first through third delay units 16a, 17a, and 18a which are placed between the first and the third taps 11 and 13, between the second and the fourth taps 12 and 14, and between the third and the fifth taps 13 and 15, respectively. Each of the first through the third delay units 16a, 17a, and 18a provides twice the unit delay which is substantially equal to the reciprocal of the input data rate.

The first parallel converted signal $D_{n+0.5}$ is delivered to the first tap 11 and successively delayed by the first delay unit 16a to be produced as a third tap signal $D_{n-0.5}$ which is sent to the third tap 13. Likewise, the second parallel converted signal $D_n$ is delivered to the second tap 12 and successively delayed by the second delay unit 17a to be produced as a fourth tap signal $D_{n-1.0}$ which is sent to the fourth tap 14. The third tap signal $D_{n-0.5}$ is delayed by the third delay unit 18a to be produced as a fifth tap signal $D_{n-1.5}$ which is sent to the fifth tap 15. At any rate, the delay circuit 10a produces the first through the fifth tap signals $D_{n+0.5}$, $D_n$, $D_{n-0.5}$, $D_{n-1.0}$, and $D_{n-1.5}$.

The first through the third tap signals $D_{n+0.5}$, $D_n$, and $D_{n-0.5}$ are supplied to the first latch circuit 21. The first latch circuit 21 latches the first through the third tap signals $D_{n+0.5}$, $D_n$, and $D_{n-0.5}$ and holds these signals during a time duration corresponding to four input time slots of the input signal IN to produce first through third primary latched signals $D_{2m+0.5}$, $D_{2m}$, and $D_{2m-0.5}$. Likewise, the third through the fifth tap signals $D_{n-0.5}$, $D_{n-1.0}$, and $D_{n-1.5}$ are supplied to the second latch circuit 22. The second latch circuit 22 latches the third through the fifth tap signals $D_{n-0.5}$, $D_{n-1.0}$, and $D_{n-1.5}$ and holds these signals during the time duration corresponding to the four time slots to produce first through third subsidiary latched signals $D_{2m-0.5}$, $D_{2m-1.0}$, and $D_{2m-1.5}$. That is, each of the first and the second latch circuits 21 and 22 is connected to the first and the second tapped delay lines of the delay circuit 10a.

The first through the third primary latched signals $D_{2m+0.5}$, $D_{2m}$, and $D_{2m-0.5}$ are supplied to the first calculation circuit 31 as first through third primary tap signals, respectively. The first through the third subsidiary latched signals $D_{2m-0.5}$, $D_{2m-1.0}$, and $D_{2m-1.5}$ are supplied to the second calculation circuit 31 as first through third subsidiary tap signals, respectively.

In the first calculation circuit 31, the first through the third primary multiplying circuits 311 to 313 are supplied with the first through the third primary tap signals $D_{2m+0.5}$, $D_{2m}$, and $D_{2m-0.5}$. The first primary multiplying circuit 311 multiplies the first primary tap signal $D_{2m+0.5}$ by the first tap gain $C_{-1}$ to produce a first primary product signal indicative of a product of the first primary tap signal $D_{2m+0.5}$ and the first tap gain $C_{-1}$. The second primary multiplying circuit 312 multiplies the second primary tap signal $D_{2m}$ by the second tap gain $C_0$ to produce a second primary product signal indicative of a product of the second primary tap signal $D_{2m}$ and the second tap gain $C_0$. The third primary multiplying circuit 313 multiplies the third primary tap signal $D_{2m-0.5}$ by the third tap gain $C_1$ to produce a third primary product signal indicative of a product of the third primary tap signal $D_{2m-0.5}$ and the third tap gain $C_1$. The first through the third primary product signals are supplied to the first adding circuit 314. The first adding circuit 314 adds up three terms of the first through the third primary product signals to produce a first addition result signal $D_{2m}'$ indicative of a first addition result of the three terms.

In the second calculation circuit 32, the first through the third subsidiary multiplying circuits 321 to 323 are supplied with the first through the third subsidiary tap signals $D_{2m-0.5}$, $D_{2m-1.0}$, and $D_{2m-1.5}$. The first subsidiary multiplying circuit 321 multiplies the first subsidiary tap signal $D_{2m-0.5}$ by the first tap gain $C_{-1}$ to produce a first subsidiary product signal indicative of a product of the first subsidiary tap signal $D_{2m-0.5}$ and the first tap gain $C_{-1}$. The second subsidiary multiplying circuit 322 multiplies the second subsidiary tap signal $D_{2m-1.0}$ by the second tap gain $C_0$ to produce a second subsidiary product signal indicative of a product of the second subsidiary tap signal $D_{2m-1.0}$ and the second tap gain $C_0$. The third subsidiary multiplying circuit 323 multiplies the third subsidiary tap signal $D_{2m-1.5}$ by the third tap gain $C_1$ to produce a third subsidiary product signal indicative of a product of the third subsidiary tap signal $D_{2m-1.5}$ and the third tap gain $C_1$. The first through the third subsidiary product signals are supplied to the second adding circuit 324. The second adding circuit 324 adds up three terms of the first through the third subsidiary product signals to produce a second addition result signal $D_{2m-1}'$ indicative of a second addition result of the three terms.

The first and the second addition result signals $D_{2m}'$ and $D_{2m-1}'$ are supplied to the parallel-serial converter 35. The parallel-serial converter 35 carries out a parallel-serial conversion on or couples the first and the second addition result signals $D_{2m}'$ and $D_{2m-1}'$ to produce a serial converted signal $D_{n-1}'$ as the output signal OUT.

As apparent from the above description, the first and the second addition result signals $D_{2m}'$ and $D_{2m-1}'$ are given by:

$$D_{2m}' = C_{-1} \times D_{2m+0.5} + C_0 \times D_{2m} + C_1 \times D_{2m-0.5}$$

and $$D_{2m-1}' = C_{-1} \times D_{2m-0.5} + C_0 \times D_{2m-1.0} + C_1 \times D_{2m-1.5}.$$

The output signal OUT or the serial converted signal $D_n'$ is therefore given by:

$$D_n' = C_{-1} \times D_{n+0.5} + C_0 \times D_n + C_1 \times D_{n-0.5}.$$

Referring to FIG. 6 in addition to FIG. 5, description will be directed to operation of the transversal filter illustrated in FIG. 5. First through eighteenth input time slots are indicated along a first or top line in FIG. 6 by numerals 1 through 18.

The input signal IN or $D_{0.5(k+1)}$ is indicated along a second line. Third through seventh lines show the first through the fifth tap signals $D_{n+0.5}$, $D_n$, $D_{n-0.5}$, $D_{n-1.0}$, and $D_{n-1.5}$, respectively. Eighth through tenth lines show the first through the third primary tap signals $D_{2m+0.5}$, $D_{2m}$, and $D_{2m-0.5}$ which are supplied to the first through the third primary multiplying circuits 311 to 313 in the first calculation circuit 31, respectively. Eleventh through thirteenth lines show the first through the third subsidiary tap signals $D_{2m-0.5}$, $D_{2m-1.0}$, and $D_{2m-1.5}$ which are supplied to the first through the third subsidiary multiplying circuits 321 to 323 in the second calculation circuit 32, respectively. Fourteenth and fifteenth lines show the first and the second addition result signals $D_{2m}'$ and $D_{2m-1}'$, respectively. A sixteenth line shows the output signal OUT or the serial converted signal $D_{n-1}'$.

The input signal IN or $D_{0.5(k+1)}$ comprises a series of input elements such as first through eighteenth input elements $D_{0.5}$, $D_{1.0}$, $D_{1.5}$, $D_{2.0}$, $D_{2.5}$, $D_{3.0}$, $D_{3.5}$, $D_{4.0}$, $D_{4.5}$, $D_{5.0}$, $D_{5.5}$, $D_{6.0}$, $D_{6.5}$, $D_{7.0}$, $D_{7.5}$, $D_{8.0}$, $D_{8.5}$, and $D_{9.0}$ of the first through the eighteenth input time slots 1 to 18.

The first tap signal $D_{n+0.5}$ comprises a series of primary tap elements having input time slots each of which is equal in number to an odd number such as the first input element $D_{0.5}$ of the first input time slot 1, the third input element $D_{1.5}$ of the third input time slot 3, the fifth input element $D_{2.5}$ of the fifth input time slot 5, the seventh input element $D_{3.5}$ of the seventh input time slot 7, the ninth input element $D_{4.5}$ of the ninth input time slot 9, the eleventh input element $D_{5.5}$ of the eleventh input time slot 11, the thirteenth input element $D_{6.5}$ of the thirteenth input time slot 13, the fifteenth input element $D_{7.5}$ of the fifteenth input time slot 15, the seventeenth input element $D_{8.5}$ of the seventeenth input time slot 17.

The second tap signal $D_n$ comprises a series of secondary tap elements having input time slots each of which is equal in number to an even number such as a zeroth input element $D_{0.0}$ of a zeroth input time slot 0, the second input element $D_{1.0}$ of the second input time slot 2, the fourth input element $D_{2.0}$ of the fourth input time slot 4, the sixth input element $D_{3.0}$ of the sixth input time slot 6, the eighth input element $D_{4.0}$ of the eighth input time slot 8, the tenth input element $D_{5.0}$ of the tenth input time slot 10, the twelfth input element $D_{6.0}$ of the twelfth input time slot 12, the fourteenth input element $D_{7.0}$ of the fourteenth input time slot 14, the sixteenth input element $D_{8.0}$ of the sixteenth input time slot 16.

The third tap signal $D_{n-0.5}$ comprises a series of tertiary tap elements having input time slots each of which is equal in number to an odd number such as a (−1)-th input element $D_{-0.5}$ of a (−1)-th input time slot −1, the first input element $D_{0.5}$ of the first input time slot 1, the third input element $D_{1.5}$ of the third input time slot 3, the fifth input element $D_{2.5}$ of the fifth input time slot 5, the seventh input element $D_{3.5}$ of the seventh input time slot 7, the ninth input element $D_{4.5}$ of the ninth input time slot 9, the eleventh input element $D_{5.5}$ of the eleventh input time slot 11, the thirteenth input element $D_{6.5}$ of the thirteenth input time slot 13, the fifteenth input element $D_{7.5}$ of the fifteenth input time slot 15.

The fourth tap signal $D_{n-1.0}$ comprises a series of quaternary tap elements having input time slots each of which is equal in number to an even number such as a (−2)-th input element $D_{-1.0}$ of a (−2)-th input time slot −2, the zeroth input element $D_{0.0}$ of a zeroth input time slot 0, the second input element $D_{1.0}$ of the second input time slot 2, the fourth input element $D_{2.0}$ of the fourth input time slot 4, the sixth input element $D_{3.0}$ of the sixth input time slot 6, the eighth input element $D_{4.0}$ of the eighth input time slot 8, the tenth input element $D_{5.0}$ of the tenth input time slot 10, the twelfth input element $D_{6.0}$ of the twelfth input time slot 12, the fourteenth input element $D_{7.0}$ of the fourteenth input time slot 14.

The fifth tap signal $D_{n-1.5}$ comprises a series of binary tap elements having input time slots each of which is equal to an odd number such as a (−3)-th input element $D_{-1.5}$ of a (−3)-th input time slot −3, the (−1)-th input element $D_{-0.5}$ of a (−1)-th input time slot −1, the first input element $D_{0.5}$ of the first input time slot 1, the third input element $D_{1.5}$ of the third input time slot 3, the fifth input element $D_{2.5}$ of the fifth input time slot 5, the seventh input element $D_{3.5}$ of the seventh input time slot 7, the ninth input element $D_{4.5}$ of the ninth input time slot 9, the eleventh input element $D_{5.5}$ of the eleventh input time slot 11, the thirteenth input element $D_{6.5}$ of the thirteenth input time slot 13.

The first primary tap signal $D_{2m+0.5}$ comprises a series of primary latched elements having (4n+1)-th input time slots such as the first input element $D_{0.5}$ of the first input time slot 1, the fifth input element $D_{2.5}$ of the fifth input time slot 5, the ninth input element $D_{4.5}$ of the ninth input time slot 9, the thirteenth input element $D_{6.5}$ of the thirteenth input time slot 13. The second primary tap signal $D_{2m}$ comprises a series of primary latched elements having (4n)-th input time slots such as the zeroth input element $D_{0.0}$ of a zeroth input time slot 0, the fourth input element $D_{2.0}$ of the fourth input time slot 4, the eighth input element $D_{4.0}$ of the eighth input time slot 8, the twelfth input element $D_{6.0}$ of the twelfth input time slot 12. The third primary tap signal $D_{2m-0.5}$ comprises a series of primary latched elements having (4n-1)-th input time slots such as the (-1)-th input element $D_{-0.5}$ of the (-1)-th input time slot -1, the third input element $D_{1.5}$ of the third input time slot 3, the seventh input element $D_{3.5}$ of the seventh input time slot 7, the eleventh input element $D_{5.5}$ of the eighth input time slot 11.

The first subsidiary tap signal $D_{2m-0.5}$ comprises a series of subsidiary latched elements having (4n-1)-th input time slots such as the (-1)-th input element $D_{-0.5}$ of the (-1)-th input time slot -1, the third input element $D_{1.5}$ of the third input time slot 3, the seventh input element $D_{3.5}$ of the seventh input time slot 7, the eleventh input element $D_{5.5}$ of the eleventh input time slot 11. The second subsidiary tap signal $D_{2m-1.0}$ comprises a series of subsidiary latched elements having (4n-2)-th input time slots such as the (-2)-th input element $D_{-1.0}$ of the (-2)-th input time slot -2, the second input element $D_{1.0}$ of the second input time slot 2, the sixth input element $D_{3.0}$ of the sixth input time slot 6, the tenth input element $D_{5.0}$ of the tenth input time slot 10. The third subsidiary tap signal $D_{2m-1.5}$ comprises a series of subsidiary latched elements having (4n-3)-th input time slots such as the (-3)-th input element $D_{-1.5}$ of the (-3)-th input time slot -3, the first input element $D_{0.5}$ of the first input time slot 1, the fifth input element $D_{2.5}$ of the fifth input time slot 5, the ninth input element $D_{4.5}$ of the ninth input time slot 9.

The first addition result signal $D_{2m}'$ comprises a series of addition result elements having output time slots each of which is equal in number to an even number such as a zeroth addition result element $D_{0.0}'$ of a zeroth output time slot, a second addition result element $D_{2.0}'$ of a second output time slot, a fourth addition result element $D_{4.0}'$ of the fourth output time slot, a sixth addition result element $D_{6.0}'$ of the sixth output time slot. Similarly, the second addition result signal $D_{2m+1}'$ comprises a series of addition result elements having output time slots each of which is equal in number to an odd number such as a (-1)-th addition result element $D_{-1.0}'$ of a (-1)-th output time slot, a first addition result element $D_{1.0}'$ of a first output time slot, a third addition result element $D_{3.0}'$ of a third output time slot, a fifth addition result element $D_{5.0}'$ of a fifth output time slot.

The output signal OUT or the serial converted signal $D_{n-1}'$ comprises a series of the addition result elements such as the (-1)-th through the sixth addition result elements $D_{-1.0}'$ to $D_{6.0}'$ of the (-1)-th through the sixth output time slots.

In the above-mentioned embodiments, the serial-parallel converter 40 carries out serial-parallel conversion on the digital input signal IN into which an analog input signal is converted by an analog-to-digital converter (not shown).

Figure 7:
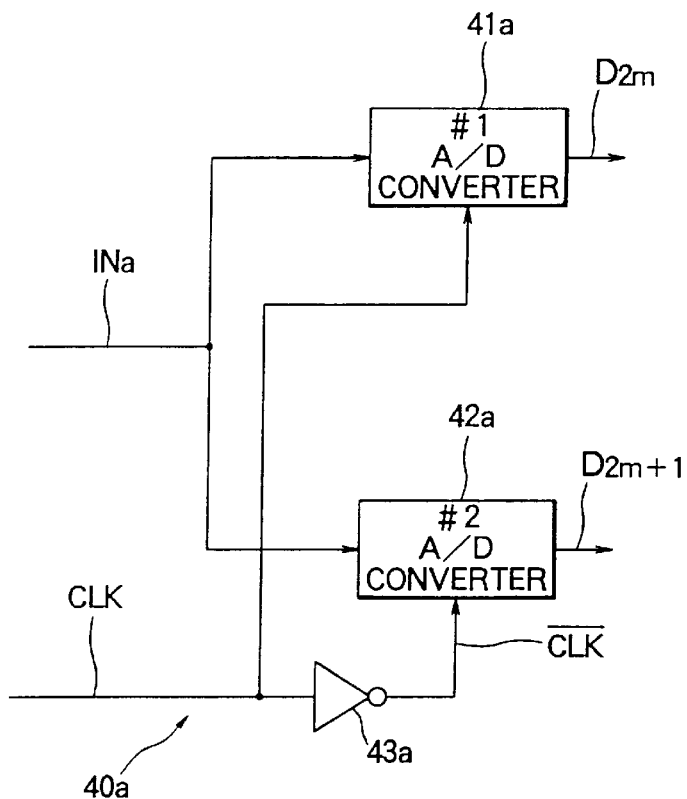
FIG. 7 is a block diagram of a modified serial-parallel converter into which a serial-parallel converter for use in the transversal filter illustrated in FIG. 3 is modified.

Referring to FIG. 7, the description will be directed to another serial-parallel converter 40a. The serial-parallel converter 40a is supplied with the analog input signal depicted at INa instead of the digital input signal IN. In addition, the serial-parallel converter 40a is supplied with an input clock signal CLK having a clock frequency which is equal to a half of the input data rate of the analog input signal INa.

The serial-parallel converter 40a comprises first and second analog-to-digital (A/D) converter 41a and 42a and an inverting circuit 43a. The first A/D converter 41a is supplied with the analog input signal INa and the input clock signal CLK. The first A/D converter 41a converts the analog input signal INa into a first digital converted signal $D_{2m}$ in synchronism with the input clock signal CLK. In particular, the first A/D converter 41a converts, in response to leading edge of the input clock signal CLK, input analog values of the analog input signal INa into the first digital converted signal $D_{2m}$. The first digital converted signal $D_{2m}$ is produced as the second parallel converted signal.

The inverting circuit 43a is supplied with the input clock signal CLK. The inverting circuit 43a inverts the input clock signal CLK to produce an inverted clock signal $\overline{CLK}$. The inverted clock signal $\overline{CLK}$ is supplied to the second A/D converter 42a which is supplied with the analog input signal INa. The second A/D converter 42a converts the analog input signal INa into a second digital converted signal $D_{2m+1}$ in synchronism with the inverted clock signal $\overline{CLK}$. In particular, the second A/D converter 42a converts, in response to leading edge of the inverted clock signal $\overline{CLK}$, input analog values of the analog input signal INa into the second digital converted signal $D_{2m+1}$. The second digital converted signal $D_{2m+1}$ is produced as the first parallel converted signal.

At any rate, the analog input signal INa is converted into the first and the second digital converted signals $D_{2m}$ and $D_{2m+1}$ by the first and the second A/D converters 41a and 42a at two different timings.

Figure 8:
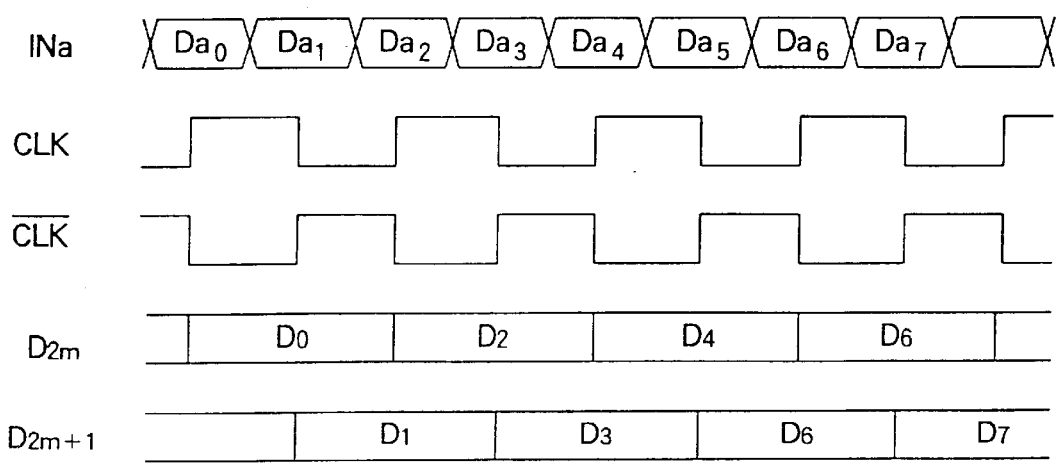
FIG. 8 shows a time chart for use in an operation of the modified serial-parallel converter illustrated in FIG. 7.

Turning to FIG. 8 in addition to FIG. 7, description will be directed to operation of the serial-parallel converter 40a. The analog input signal INa is indicated along a first or top line in FIG. 8. Second and third lines show the input clock signal CLK and the inverted clock signal $\overline{CLK}$, respectively. Fourth and fifth lines show the first and the second digital converted signals $D_{2m}$ and $D_{2m+1}$, respectively.

The analog input signal INa comprises a series of zeroth through seventh input analog values $Da_0$, $Da_1$, $Da_2$, $Da_3$, $Da_4$, $Da_5$, $Da_6$, and $Da_7$. The input clock signal CLK has the leading edges where the input analog values each of which is equal in number to an even number such as the zeroth input analog value $Da_0$, the second input analog value $Da_2$, the fourth input analog value $Da_4$, the sixth input analog value $Da_6$ are present. The inverted clock signal $\overline{CLK}$ has the leading edges where the input analog values each of which is equal in number to an odd number such as the first input analog value $Da_1$, the third input analog value $Da_3$, the fifth input analog value $Da_5$, the seventh input analog value $Da_7$ are present.

It will be assumed that the zeroth through the seventh input analog values $Da_0$, to $Da_7$ correspond to zeroth through seventh digital values $D_0$, $D_1$, $D_2$, $D_3$, $D_4$, $D_5$, $D_6$, and $D_7$, respectively. The first digital converted signal $D_{2m}$ comprises a series of primary digital converted elements having the digital values each of which is equal in number to an even number such as the zeroth digital value $D_0$, the second digital value $D_2$, the fourth digital value $D_4$, the sixth digital value $D_6$. The second digital converted signal $D_{2m+1}$ comprises a series of secondary digital converted elements having the digital values each of which is equal in number to an odd number such as the first digital value $D_1$, the third digital value $D_3$, the fifth digital value $D_5$, and the seventh digital value $D_7$.

While this invention has thus far been described in conjunction with a few embodiments thereof, it will now be readily possible for those skilled in the art to put this invention into practice in various other manners.

What is claimed is:

1. A transversal filter for filtering an input signal into an output signal in response to first through J-th tap gains, where J represents a first positive integer which is not less than two, the input signal having an input data rate while the output signal has an output data rate which is equal to the input data rate, said transversal filter comprising:

a serial-parallel converter for converting the input signal into first through M-th parallel converted signals, where M represents a second positive integer which is not less than two;

a delay circuit connected to said serial-parallel converter and having first through L-th taps, where L represents a third positive integer which is greater than the first positive integer J, said delay circuit including first through M-th tapped delay lines provided with the first through the M-th parallel converted signals, respectively, said first through said M-th tapped delay lines each having at least a selected two of the first through the L-th taps, and said delay circuit including a plurality of delay units each of which corresponds to one of said first through M-th tapped delay lines and is connected between said at least two taps selected for said corresponding first through M-th tapped delay line from the first through the L-th taps, each of the delay units providing a delay of M times a unit delay which is substantially equal to a reciprocal of the input data rate, the first through the L-th taps of said delay circuit producing first through L-th tap signals, respectively;

first through M-th calculation circuits each of which is provided with the first through the J-th tap gains and J tap signals selected from the first through the L-th tap signals, each of said first through said M-th calculation circuits being connected to each of said first through said M-th tapped delay lines, said first through said M-th calculation circuits for carrying out a calculation operation on the J tap signals using the first through the J-th tap gains to produce first through M-th calculation result signals, respectively; and a coupling circuit, connected to said first through said M-th calculation circuits, for coupling the first through the M-th calculation result signals to produce said output signal.

2. A transversal filter as claimed in claim 1, wherein each of said first through said M-th calculation circuits comprises:

first through J-th multiplying circuits, supplied with the J tap signals and the first through the J-th tap gains, for multiplying the J tap signals by the first through the J-th tap gains to produce first through J-th product signals, respectively; and an adding circuit, connected to said first through said J-th multiplying circuits, for adding J terms of the first through the J-th product signals to produce an addition signal as one of the first through the M-th calculation result signals.

3. A transversal filter for filtering an input signal into an output signal in response to first through J-th tap gains, where J represents a first positive integer which is not less than two, the input signal has an input data rate while the output signal has an output data rate which is a half of the input data rate, said transversal filter comprising:

a serial-parallel converter for converting the input signal into first through M-th parallel converted signals, where M represents a second positive integer which is not less than two;

a delay circuit connected to said serial-parallel converter and having first through L-th taps, where L represents a third positive integer which is greater than the first positive integer J, said delay circuit including first through M-th tapped delay lines provided with the first through the M-th parallel converted signals, respectively, said first through said M-th tapped delay lines each having at least a selected two of the first through the L-th taps, and said delay circuit including a plurality of delay units each of which corresponds to one of said first through M-th tapped delay lines and is connected between said at least two taps selected for said corresponding first through M-th tapped delay line from the first through the L-th taps, each of the delay units providing a delay of M times a unit delay which is substantially equal to a reciprocal of the input data rate, the first through the L-th taps of said delay circuit producing first through L-th tap signals, respectively;

first through M-th latch circuits each of which is supplied with J tap signals selected from the first through the L-th tap signals, each of said first through said M-th latch circuits being connected to each of said first through said M-th tapped delay lines, and each of said first through said M-th latch circuits latching the J tap signals and holding the J tap signals during a time duration which is substantially equal to M times a reciprocal of the output data rate to produce first through J-th latch signals;

first through M-th calculation circuits, connected to said first through said M-th latch circuits, respectively, and each of which is provided with the first through the J-th tap gains, said first through said M-th calculation circuits for carrying out a calculation operation on the first through the J-th latch signals using the first through the J-th tap gains to produce first through M-th calculation result signals, respectively; and a coupling circuit, connected to said first through said M-th calculation circuits, for coupling the first through the M-th calculation result signals to produce said output signal.

4. A transversal filter as claimed in claim 3, wherein each of said first through said M-th calculation circuits comprises:

first through J-th multiplying circuits, supplied with the first through the J tap signals and the first through the J-th tap gains, respectively, for multiplying the first through the J-th latch signals by the first through the J-th tap gains to produce first through J-th product signals, respectively; and an adding circuit, connected to said first through said J-th multiplying circuits, for adding J terms of the first through the J-th product signals to produce an addition signal as one of the first through the M-th calculation result signals.

* * * * *